(12) United States Patent
Yoo et al.

(10) Patent No.: US 7,781,156 B2
(45) Date of Patent: Aug. 24, 2010

(54) PRINTING PLATE, METHOD OF FABRICATING THE SAME, AND METHOD OF FABRICATING FLAT PANEL DISPLAY USING THE SAME

(75) Inventors: Soon Sung Yoo, Gyeonggi-do (KR); Youn Gyoung Chang, Gyeonggi-do (KR); Heung Lyul Cho, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 11/413,571

(22) Filed: Apr. 28, 2006

(65) Prior Publication Data
US 2007/0048667 A1 Mar. 1, 2007

(30) Foreign Application Priority Data
Aug. 31, 2005 (KR) ................ 10-2005-0080558

(51) Int. Cl.
*G03C 11/00* (2006.01)
*G03F 1/00* (2006.01)
*H01L 21/00* (2006.01)
(52) U.S. Cl. .............. 430/325; 430/311; 430/313; 430/321
(58) Field of Classification Search .......... 430/7, 430/302; 438/151, 159
See application file for complete search history.

(56) References Cited

U.S. PATENT DOCUMENTS

| 2005/0130353 A1* | 6/2005 | Yoo et al. | 438/151 |
| 2005/0218794 A1* | 10/2005 | Seo et al. | 313/504 |
| 2006/0057478 A1* | 3/2006 | Kwon et al. | 430/7 |
| 2006/0262256 A1* | 11/2006 | Kim | 349/114 |

FOREIGN PATENT DOCUMENTS

| JP | 2002-299348 | 10/2002 |
| JP | 2004-280126 | 10/2004 |
| JP | 2005-209756 | 8/2005 |

OTHER PUBLICATIONS

Office Action issued in corresponding Japanese Patent Application No. 2006-149297; issued Nov. 2, 2009.

* cited by examiner

*Primary Examiner*—Cynthia H Kelly
*Assistant Examiner*—Chanceity N Robinson
(74) *Attorney, Agent, or Firm*—Brinks Hofer Gilson & Lione

(57) ABSTRACT

A method of fabricating a printing plate includes: preparing a substrate; forming a metal layer on an entire surface of the substrate; forming a resist pattern on the metal layer, the resist pattern having a fine pattern exposing a portion of the metal layer; wet etching the exposed metal layer, and removing the resist pattern to form a metal layer pattern exposing a portion of the substrate; wet etching the exposed substrate, and removing the metal layer pattern to form a recessed (⊔) pattern; and forming a compensation layer on an entire surface of the substrate where the recessed (⊔) pattern is formed.

3 Claims, 4 Drawing Sheets

PRINTING PLATE, METHOD OF FABRICATING THE SAME, AND METHOD OF FABRICATING FLAT PANEL DISPLAY USING THE SAME

This application claims the benefit of priority to Korean Patent Application No. 080558/2005 filed on Aug. 31, 2005, herein incorporated by reference.

FIELD OF THE INVENTION

The present invention relates to a method of fabricating a flat panel display, and more particularly, to a printing plate, a method of fabricating the same, and a method of fabricating a flat panel display using the same, capable of forming fine patterns.

BACKGROUND OF THE INVENTION

With the rapid development of the information society, flat panel displays with favorable characteristics, such as slim profile, lightweight, and low power consumption are increasingly demanded. In addition, fineness and high preciseness are required in interconnections among components of the flat panel device.

Related art interconnections are formed by forming resist patterns using a photolithography or printing method and patterning a conductive layer along the resist patterns. When forming the fine interconnections, it is important to finely form the resist patterns.

At this point, the photolithography process is advantageous to forming the fine resist patterns. In the photolithography process, however, complex processes such as an exposure process and a development process are performed, thus degrading the production efficiency.

Unlike the photolithography process, the printing method has an excellent advantage in terms of production efficiency, but it has a disadvantage in forming a fine pattern.

For example, in the case of a screen printing method, since a resist pattern has a thickness of several ten micrometers, it can form a resist pattern with an excellent corrosion resistance, but it is difficult to form a complicated and fine pattern.

In the case of an offset printing method, a resist pattern is formed by transferring a resist layer on a substrate using a printing plate with a recessed (凹) pattern. To form a fine resist pattern, it is important to precisely form the recessed (凹) pattern. However, it is difficult to form a printing plate with a fine recessed (凹) pattern.

FIG. 1 is a photograph illustrating an enlarged section of a region where a recessed (凹) pattern is formed in a related art printing plate.

Referring to FIG. 1, when a recessed (凹) pattern is formed by wet etching a substrate, a CD-bias of the recessed (凹) pattern occurs due to an isotropic etch characteristic of the wet etching, thus increasing the width of the recessed (凹) pattern. That is, the width of the recessed (凹) pattern increases two times as much as the depth of the recessed (凹) pattern.

At this point, if the recessed (凹) pattern is formed to have a small depth so as to decrease the width of the recessed (凹) pattern, the thickness of the resist pattern becomes small, resulting in a decrease in the corrosion resistance. Therefore, when the interconnections are formed by patterning the conductive layer, it is practically impossible to form the interconnections in a desired pattern.

SUMMARY OF THE INVENTION

The present invention is directed to a printing plate, a method of fabricating the same, and a method of fabricating a flat panel display using the same that substantially obviate one or more problems due to limitations and disadvantages of the related art.

An objective of the present invention is to provide a printing plate and a method of fabricating the same, capable of forming fine patterns having a high precision.

Another objective of the present invention is to provide a method of fabricating a flat panel display with fine patterns having a high precision.

Additional advantages, objectives, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

A printing plate is provided. The printing plate comprises a substrate having a recessed (凹) pattern and a compensation layer formed on an entire surface of the substrate having the recessed (凹) pattern.

In another aspect of the present invention, there is provided a method of fabricating a printing plate. The method comprises preparing a substrate and forming a metal layer on an entire surface of the substrate. The method further includes a step of forming a resist pattern on the metal layer with the resist pattern having a fine pattern exposing a portion of the metal layer. Wet etching the exposed metal layer and removing the resist pattern to form a metal layer pattern exposing a portion of the substrate is then performed, followed by wet etching the exposed substrate and removing the metal layer pattern to form a recessed (凹) pattern. Finally the method includes a step of forming a compensation layer on an entire surface of the substrate where the recessed (凹) pattern is formed.

In a further aspect of the present invention, there is provided a method of fabricating a flat panel display. The method comprises preparing a substrate and depositing a conductive material on the substrate. The method further includes a step of patterning the deposited conductive material to form a gate electrode and a gate line. The next step is forming a gate insulating layer on an entire surface of the substrate where the gate electrode and the gate line are formed, followed by forming an active layer on the gate insulating layer corresponding to the gate electrode. The method further comprises depositing a conductive material on the active layer, and patterning the deposited conductive material to form source/drain electrodes and a data line, followed by forming a passivation layer on an entire surface of the substrate where the source/drain electrodes and the data line are formed, the passivation layer having a contact hole exposing a portion of the drain electrode. Finally the method includes a step of depositing a conductive material on the passivation layer, and patterning the deposited conductive material to form a pixel electrode such that the conductive layer is electrically connected to the drain electrode, wherein at least one of the gate electrode, the gate line, the active layer, the source/drain electrodes, the data line, the contact hole of the passivation layer, and the pixel electrode is formed by performing a process of forming a resist pattern using a printing plate having a compensation layer formed on an entire surface of the substrate where a recessed (⊔) portion and a protruding ⌂ portion are formed, and performing an etching process on the resulting structure.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

FIGS. 2A to 2D are sectional views for explaining a printing plate and a method of fabricating the same according to an embodiment of the present invention.

Figure 1:
FIG. 1 is a photograph illustrating an enlarged section of a region where a recessed (⊔) pattern is formed in a related printing plate.
Figure 2A:
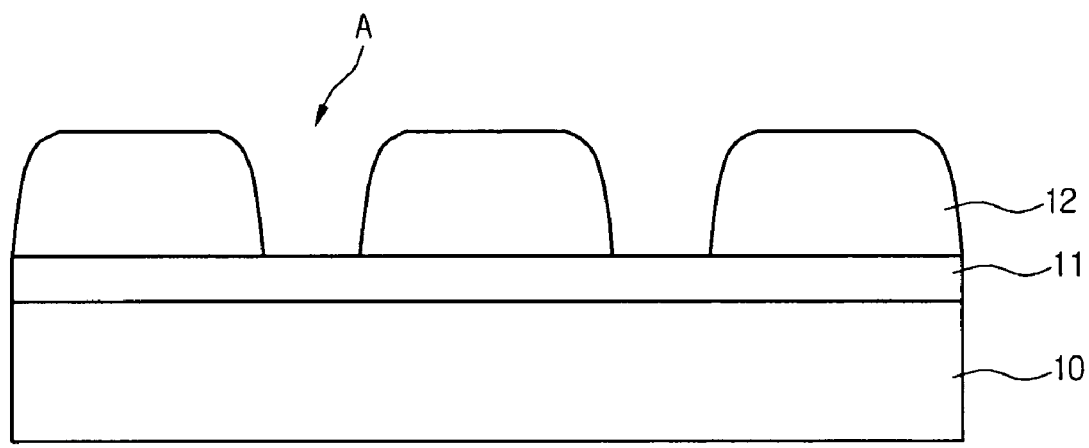
FIGS. 2A to 2D are sectional views for explaining a printing plate and a method of fabricating the same according to an embodiment of the present invention.

Referring to FIG. 2A, a substrate 10 is prepared. The substrate 10 may be formed of material selected from the group consisting of glass, plastic, and metal. A metal layer 11 is deposited on the substrate 10. It is preferable that the metal layer 11 should have a resistance against an etchant. The reason for this is that the metal layer 11 will be used as a mask in forming a recessed (⊔) pattern, which will be described later.

A resist layer is formed on the metal layer 11 by a typical method and is exposed and developed to form resist patterns 12. At this point, predetermined portions A of the metal layer 11 are exposed by the resist patterns.

Figure 2B:
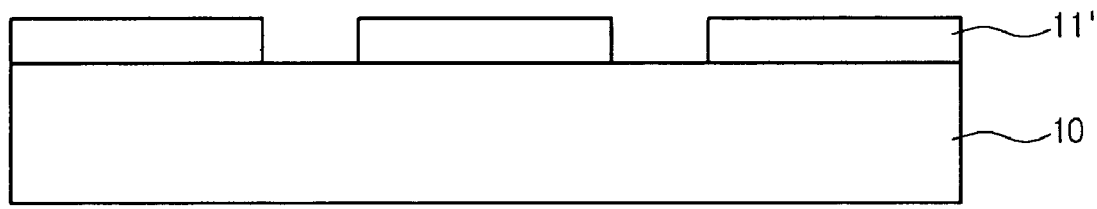

Referring to FIG. 2B, the exposed metal layer 11 is wet etched along the resist patterns 12. Then, the resist patterns 12 are removed and metal layer patterns 11' are formed.

Figure 2C:
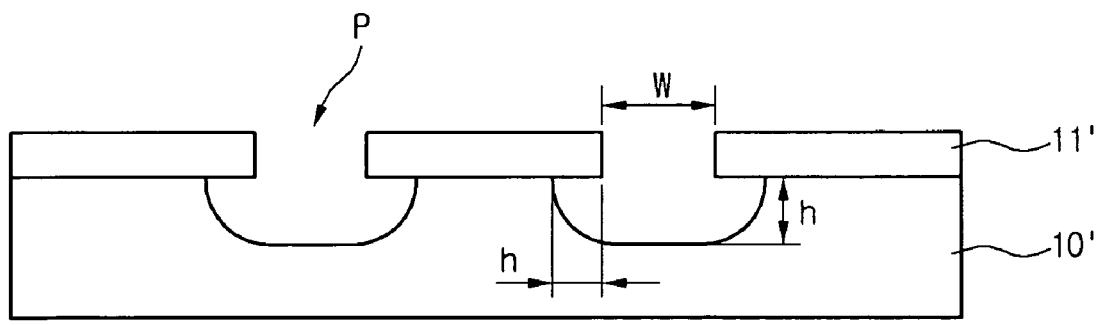

Referring to FIG. 2C, using the metal layer patterns 11' as a mask, the substrate 10 is wet etched to form recessed (⊔) patterns P. Due to an isotropic etch characteristic of the wet etching, both sides of the recessed (⊔) pattern P are over-etched as much as the depth (h) of the recessed (⊔) patterns P. Consequently, the width of the recessed (⊔) patterns P increases and thus there is a difficulty in forming a fine interconnection.

Figure 2D:
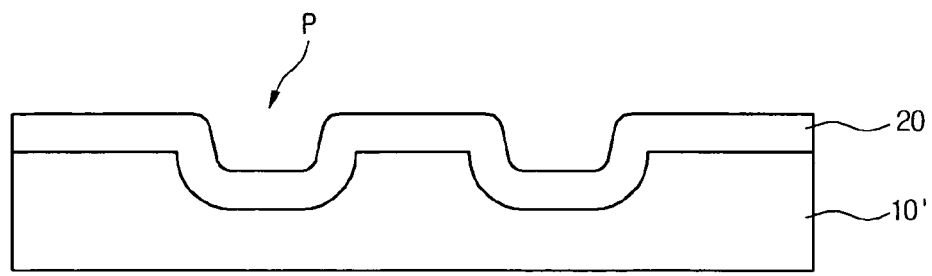

Referring to FIG. 2D, the metal layer patterns (11' in FIG. 2C) are removed. Then, a compensation layer 20 is formed on an entire surface of the substrate 10' including the recessed (⊔) patterns P. In this manner, only the width of the recessed (⊔) patterns P can be compensated without changing the shape of the recessed (⊔) patterns P.

The compensation layer 20 may be formed using a chemical vapor deposition (CVD) process or a sputtering process. Examples of the CVD process include a low pressure CVD (LPCVD), an atmospheric pressure CVD (APCVD), and a plasma enhanced CVD (PECVD).

Preferably, the compensation layer 20 is formed using inorganic-based materials. Examples of the inorganic based materials include silicon nitride, silicon oxide, silicon (Si), chrome (Cr), molybdenum (Mo), aluminum (Al), or copper (Cu).

Preferably, the compensation layer 20 is formed to have a thickness less than the depth of the recessed (⊔) pattern P. The reason for this is that the width of the desired recessed (⊔) pattern P increases as much as the depth (h) of the recessed (⊔) pattern P. More preferably, the thickness of the compensation layer 20 meets Eq. (1) below.

$$d < \frac{2h + w - 3}{2} \quad (1)$$

where d, h and w represent the thickness of the compensation layer, the depth of the recessed (⊔) pattern P, and the desired width of the recessed (⊔) pattern P, respectively.

Therefore, the width of the recessed (⊔) pattern P is compensated by two times the thickness of the compensation layer 20 and thus it is possible to fabricate the printing plate with the fine patterns.

A method of fabricating a flat panel display using the printing plate will be described below.

Figure 3A:
FIGS. 3A to 3C are sectional views illustrating a method of fabricating a flat panel display according to an embodiment of the present invention.
Figure 3B:
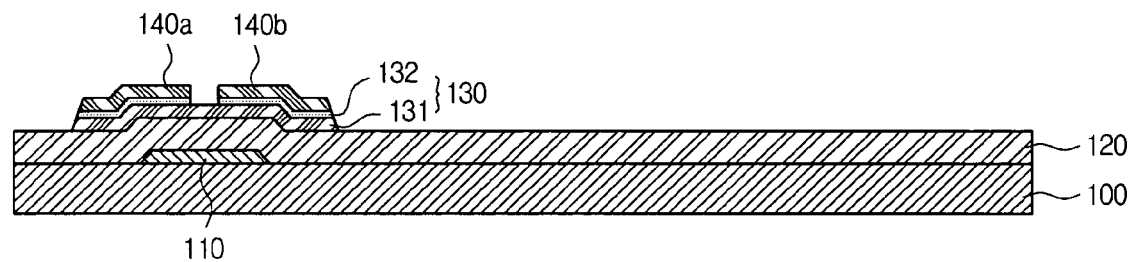
Figure 3C:
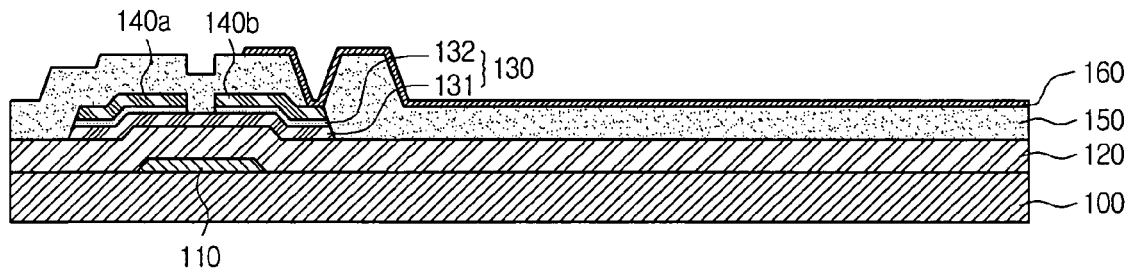

FIGS. 3A to 3C are sectional views illustrating a method of fabricating a flat panel display according to another embodiment of the present invention.

Referring to FIG. 3A, a substrate 100 is provided. The substrate 100 may be one of a plastic substrate, a glass substrate, and a metal substrate, but the present invention is not limited to them. A conductive layer is formed by depositing a conductive material for a gate electrode. Then, a first patterning process is performed on the conductive layer to form a gate electrode 110 and a gate line (not shown).

Referring to FIG. 3B, a gate insulating layer 120 is formed on an entire surface of the substrate where the gate electrode 110 and the gate line are formed. The gate insulating layer 120 may be formed of silicon nitride, silicon oxide, or a stacked layer thereof. The gate insulating layer 120 may be formed by a CVD process or a sputtering process.

Then, a channel layer 131 and an ohmic contact layer 132 are sequentially stacked on the gate insulating layer 120 corresponding to a gate electrode 110. The channel layer 131 may be formed of amorphous silicon and the ohmic contact layer 132 may be formed of amorphous silicon with doped N-type or P-type impurities.

A conductive layer is formed by depositing a conductive material for source/drain electrodes on the stacked layer of the channel layer 131 and the ohmic layer 132. Then, a second patterning process is performed on the conductive layer to form source/drain electrodes 140a and 140b and a data line (not shown). Using the source/drain electrodes 140a and 140b as a mask, the channel layer 131 and the ohmic contact layer 132 are patterned to form an active layer 130.

In another method of forming the active layer 130 and the source/drain electrodes 140a and 140b, the active layer 130 is formed by patterning the channel layer 131 and the ohmic contact layer 132, the conductive layer is formed by depositing the conductive material for the source/drain electrodes on the active layer 130, and then a third patterning process is performed on the source/drain electrodes 140a and 140b and the data line.

Referring to FIG. 3C, a passivation layer 150 is formed on an entire surface of the substrate where the source/drain electrodes 140a and 140b and the data line are formed. Then, a fourth patterning process is performed such that a predetermined portion of the passivation layer 150 is etched to form a contact hole exposing a portion of the drain electrode 140b. The passivation layer 150 may be formed of silicon nitride, silicon oxide, acryl based compound, BCB (bensocyclobutene), or PFCB (perfluorocyclobutane).

A conductive layer for a pixel electrode is deposited on the passivation layer 150 such that its can be electrically connected to the drain electrode 140b. Then, a fifth patterning process is performed to form a pixel electrode 160. The pixel electrode may be formed of indium tin oxide (ITO) or indium zinc oxide (IZO).

One of the first to fifth patterning processes may be to form the resist pattern using the printing plate of the present invention and etch the resulting structure.

The patterning process using the printing plate of the present invention will be described below in detail with reference to FIGS. 4A to 4D.

Figure 4A:
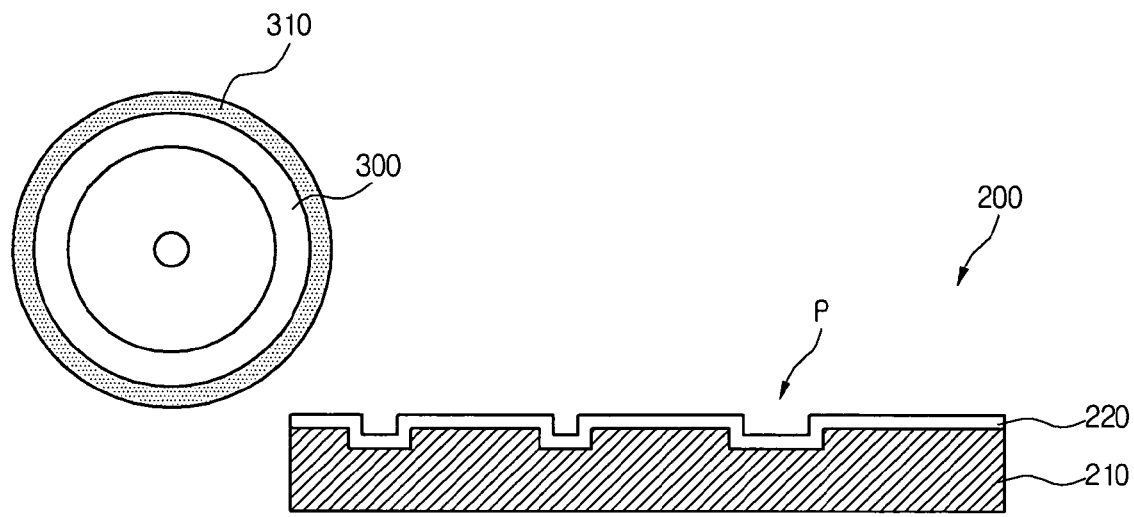
FIGS. 4A to 4D are sectional views illustrating a patterning process according to an embodiment of the present invention.

Referring to FIG. 4A, a printing plate 200 is prepared. The printing plate 200 includes a substrate 210 and a compensation layer 220. The substrate 210 has recessed (⌐⌐) patterns P, and the compensation layer 220 is formed on an entire surface of the substrate 210. The compensation layer 220 may be formed of inorganic material. The compensation layer 220 serves to compensate for the width of the recessed (⌐⌐) patterns P so as to form a fine pattern.

Meanwhile, a blanket 300 is provided. A resist layer 310 is formed on the surface of the blanket 300 by a general coating method. The general coating method may be one of a spin coating, a dip coating, a spray coating, and a doctor blade, but the present invention is not limited to them.

Figure 4B:
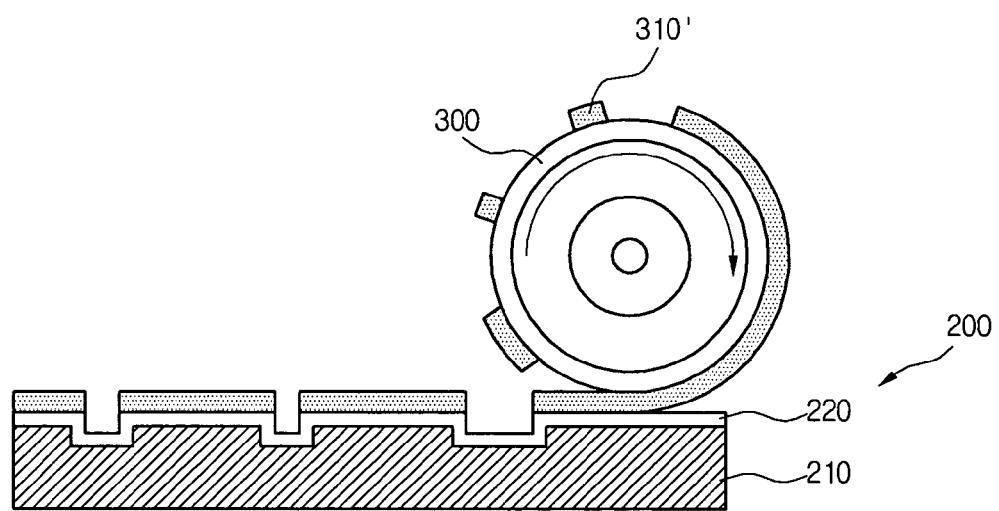

Referring to FIG. 4B, the resist layer 310 formed on the surface of the blanket 300 is transferred on the printing plate 200 to form a resist pattern 310' on the blanket 300. That is, the resist pattern is transferred on a protruding ⌐ portion of the printing plate 200 by rotating the blanket 300 on the surface of the printing plate 200. Therefore, a resist pattern 310' with the recessed portion (⌐⌐) pattern P is formed on the surface of the blanket 300.

Figure 4C:
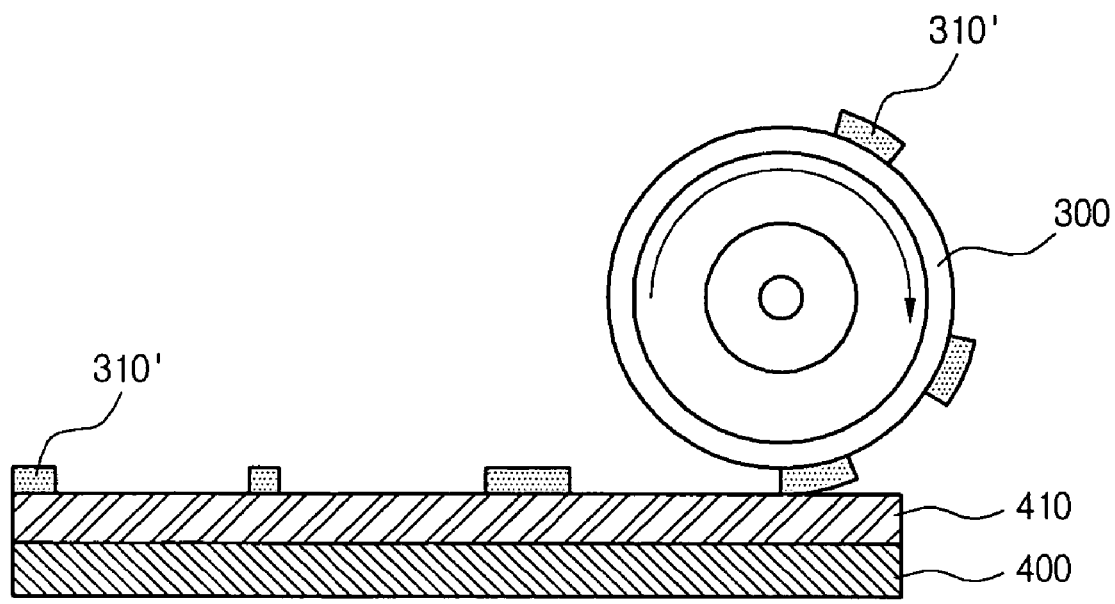

Referring to FIG. 4C, a substrate 400 with the conductive layer 410 is provided. By rotating the blanket 300 having the resist pattern 310' on the conductive layer 410, the resist pattern 310' is transferred onto the conductive layer 410. In this manner, the resist pattern 310' can be finely formed on the conductive layer 410.

Although the reverse offset printing method using the printing plate has been described as the method of forming the resist pattern, the present invention is not limited to the reverse offset printing method. That is, another offset printing method using the printing plate can be applied.

Figure 4D:
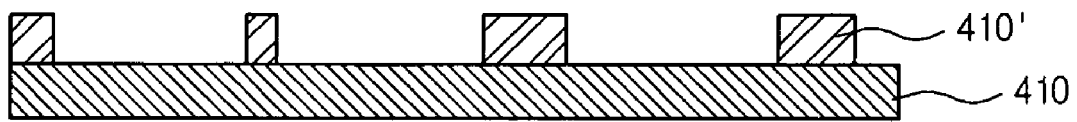

Referring to FIG. 4D, a portion of the conductive layer 410 where the resist pattern 310' is not formed is patterned by wet etching or dry etching. Then, the resist pattern 310' is removed to form the conductive pattern 410'.

Although not shown, the flat panel display is fabricated using a general method.

For example, in case where the flat panel display is a liquid crystal display (LCD), a top substrate where a color filter and a transparent electrode are formed is attached to a bottom substrate where a thin film transistor (TFT) is formed and a liquid crystal is then injected.

Also, in case where the flat panel display is an organic electroluminescence display, an organic layer having an emission layer is formed on the pixel electrode and an opposite electrode is formed on the organic layer. The organic layer may further include a charge transport layer or a charge injection layer.

According to the present invention, since the patterning process is performed using the printing plate where the recessed portion is compensated by the compensation layer, the interconnections can be formed more finely and more precisely.

In addition, since the fine and precise interconnections can be easily formed, the flat panel display including the complicated circuits can be easily fabricated.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A method of fabricating a flat panel display, comprising:
    preparing a substrate;
    depositing a first conductive material on the substrate;
    patterning the first conductive material deposited on the substrate to form a gate electrode and a gate line;
    forming a gate insulating layer on a surface of the substrate where the gate electrode and the gate line are formed;
    forming an active layer on the gate insulating layer corresponding to the gate electrode;
    depositing a second conductive material on the active layer;
    patterning the second conductive material deposited on the active layer to form source/drain electrode and a data line;
    forming a passivation layer on a surface of the substrate where the source/drain electrodes and the data line are formed, the passivation layer having a contact hole exposing a portion of the drain electrode;
    depositing a third conductive material on the passivation layer;
    patterning the third conductive material deposited on the passivation layer to form a pixel electrode such that third conductive material is electrically connected to the drain electrode; and
    forming at least one of the gate electrode, the gate line, the active layer, the source/drain electrodes, the data line, the contact hole of the passivation layer, or the pixel electrode by forming a resist pattern using printing plate having a compensation layer on an entire surface of the substrate where a recessed pattern and a protruding portion are formed, and etching a resulting structure,
    wherein the resist pattern is formed on a blanket by transferring a resist layer formed on the surface of the blanket to the printing plate,
    wherein the forming of the recessed pattern comprises providing a substrate, depositing a metal layer on the substrate, forming a resist layer on the metal layer by exposing and developing to form a resist pattern, exposing a predetermined portions of the metal layer by the resist pattern, wet etching the exposed metal layer along the resist pattern, removing the resist pattern and forming a metal layer patterns, forming the recessed pattern by wet etching the metal layer patterns as mask, removing the metal layer patterns, forming the compensation layer on an entire surface of the substrate including the recessed pattern, wherein the compensation layer is formed to have a thickness less than the depth of the recessed pattern, wherein the compensation compensates both sides of the recessed pattern over-etched because of an isotropic etch characteristic of the wet etching without changing the shape of the recessed pattern, wherein the width of the recessed pattern is compensated by the compensation layer, wherein the compensation layer is formed of inorganic material, wherein the thickness of the compensation layer meets a following equation $$d < \frac{2h+w-3}{2}$$

where d, h and w represent the thickness of the compensation layer, the depth of the recessed pattern, and a desired width of the recessed pattern, respectively, wherein the width of the recessed pattern is compensated by two times the thickness of the compensation layer.

2. The method according to claim 1, wherein the forming of the resist pattern comprises:

providing the printing plate having the recessed portion and the compensation layer formed on the surface of the substrate where the recessed portion is formed;

providing a blanket coated with a resist layer;

forming a second resist pattern on the surface of the blanket by transferring a predetermined portion of the resist pattern onto the printing plate;

providing a substrate where a conductive layer is formed; and forming the resist pattern on the conductive layer by transferring the second resist pattern on the surface of the blanket onto the conductive layer.

3. The method according to claim 1, wherein the inorganic material is formed of material selected from a group consisting of silicon nitride, silicon oxide, silicon (Si), chrome (Cr), molybdenum (Mo), aluminum (Al), copper (Cu).

* * * * *